US012094968B2

(12) United States Patent
Katou et al.

(10) Patent No.: US 12,094,968 B2
(45) Date of Patent: Sep. 17, 2024

(54) SEMICONDUCTOR DEVICE AND METHOD FOR MANUFACTURING SAME

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroaki Katou, Nonoichi Ishikawa (JP); Saya Shimomura, Komatsu Ishikawa (JP); Shotaro Baba, Kanazawa Ishikawa (JP); Atsuro Inada, Nonoichi Ishikawa (JP); Hiroshi Yoshida, Nonoichi Ishikawa (JP); Yasuhiro Kawai, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 351 days.

(21) Appl. No.: 17/461,825

(22) Filed: Aug. 30, 2021

(65) Prior Publication Data

US 2022/0285548 A1 Sep. 8, 2022

(30) Foreign Application Priority Data

Mar. 5, 2021 (JP) ................................ 2021-035045

(51) Int. Cl.
*H01L 29/78* (2006.01)
*H01L 29/40* (2006.01)
(Continued)

(52) U.S. Cl.
CPC ........ *H01L 29/7813* (2013.01); *H01L 29/407* (2013.01); *H01L 29/42376* (2013.01); *H01L 29/66734* (2013.01)

(58) Field of Classification Search
CPC ............... H01L 29/7813; H01L 29/407; H01L 29/42376; H01L 29/66734; H01L 29/0696;
(Continued)

(56) References Cited

U.S. PATENT DOCUMENTS 9,337,283 B2 5/2016 Nishiguchi
10,020,391 B2 * 7/2018 Matsuoka ........... H01L 29/7813
(Continued)

FOREIGN PATENT DOCUMENTS

CN 106549044 A 3/2017
JP 2013-065774 A 4/2013
(Continued)

*Primary Examiner* — Shahed Ahmed
*Assistant Examiner* — Khatib A Rahman
(74) *Attorney, Agent, or Firm* — Kim & Stewart LLP

(57) ABSTRACT

A semiconductor device includes a semiconductor part, first to third electrodes, and a control electrode. The first electrode is provided on a back surface of the semiconductor part. The second electrode is provided at a front surface side of the semiconductor part. The third electrode and the control electrode are provided inside a trench of the semiconductor part. The control electrode includes first and second control portions. The semiconductor device further includes first to third insulating films. The first insulating film is between the control electrode and the semiconductor part. The second insulating film covers the first and second control portions. The third insulating film is between the second electrode and the second insulating film. The third insulating film includes a portion extending between the first and second control portions. The third electrode is between the first electrode and the extension portion of the third insulating film.

9 Claims, 15 Drawing Sheets

(51) Int. Cl.
*H01L 29/423* (2006.01)
*H01L 29/66* (2006.01)

(58) Field of Classification Search
CPC ............... H01L 29/41766; H01L 29/41; H01L 29/4236
See application file for complete search history.

(56) References Cited

U.S. PATENT DOCUMENTS

| | | | |
|---|---|---|---|
| 10,062,761 | B2 * | 8/2018 | Yoshimoto ........ H01L 29/42376 |
| 10,431,491 | B2 * | 10/2019 | Fujino ................. H01L 29/0634 |
| 10,510,879 | B2 * | 12/2019 | Kawamura ......... H01L 29/7811 |
| 2013/0069150 | A1 | 3/2013 | Matsuoka et al. |
| 2013/0134505 | A1 | 5/2013 | Kobayashi |
| 2014/0179094 | A1 | 6/2014 | Kobayashi |
| 2014/0284708 | A1 | 9/2014 | Nishiwaki et al. |
| 2016/0322489 | A1 * | 11/2016 | Siemieniec ........... H01L 29/513 |
| 2018/0342415 | A1 * | 11/2018 | Fujino ................. H01L 29/0653 |
| 2018/0374950 | A1 | 12/2018 | Kobayashi |
| 2019/0088776 | A1 | 3/2019 | Shimomura et al. |
| 2020/0273978 | A1 * | 8/2020 | Ohno .................. H01L 29/1095 |

FOREIGN PATENT DOCUMENTS

| | | | |
|---|---|---|---|
| JP | 2013-115225 | A | 6/2013 |
| JP | 2014-187182 | A | 10/2014 |
| JP | 2014-207425 | A | 10/2014 |
| JP | 2017-059783 | A | 3/2017 |
| JP | 2018022858 | A | 2/2018 |
| JP | 2019-009258 | A | 1/2019 |
| JP | 2019-057596 | A | 4/2019 |
| JP | 2020004883 | A | 1/2020 |
| JP | 2020-136587 | A | 8/2020 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2021-035045, filed on Mar. 5, 2021; the entire contents of which are incorporated herein by reference.

FIELD

Embodiments relate to a semiconductor device and a method for manufacturing the same.

BACKGROUND

A semiconductor device such as a MOSFET or the like is used for power control and is required to have a high switching speed and reduce switching losses. For example, a trench gate structure is widely used for the MOSFET, in which a gate electrode and a field plate are provided inside the gate trench. In such a trench gate structure, the field plate is provided to have the same potential as the source electrode, and the enlarged gate-source parasitic capacitance may reduce the switching speed.

DETAILED DESCRIPTION

Figure 1:
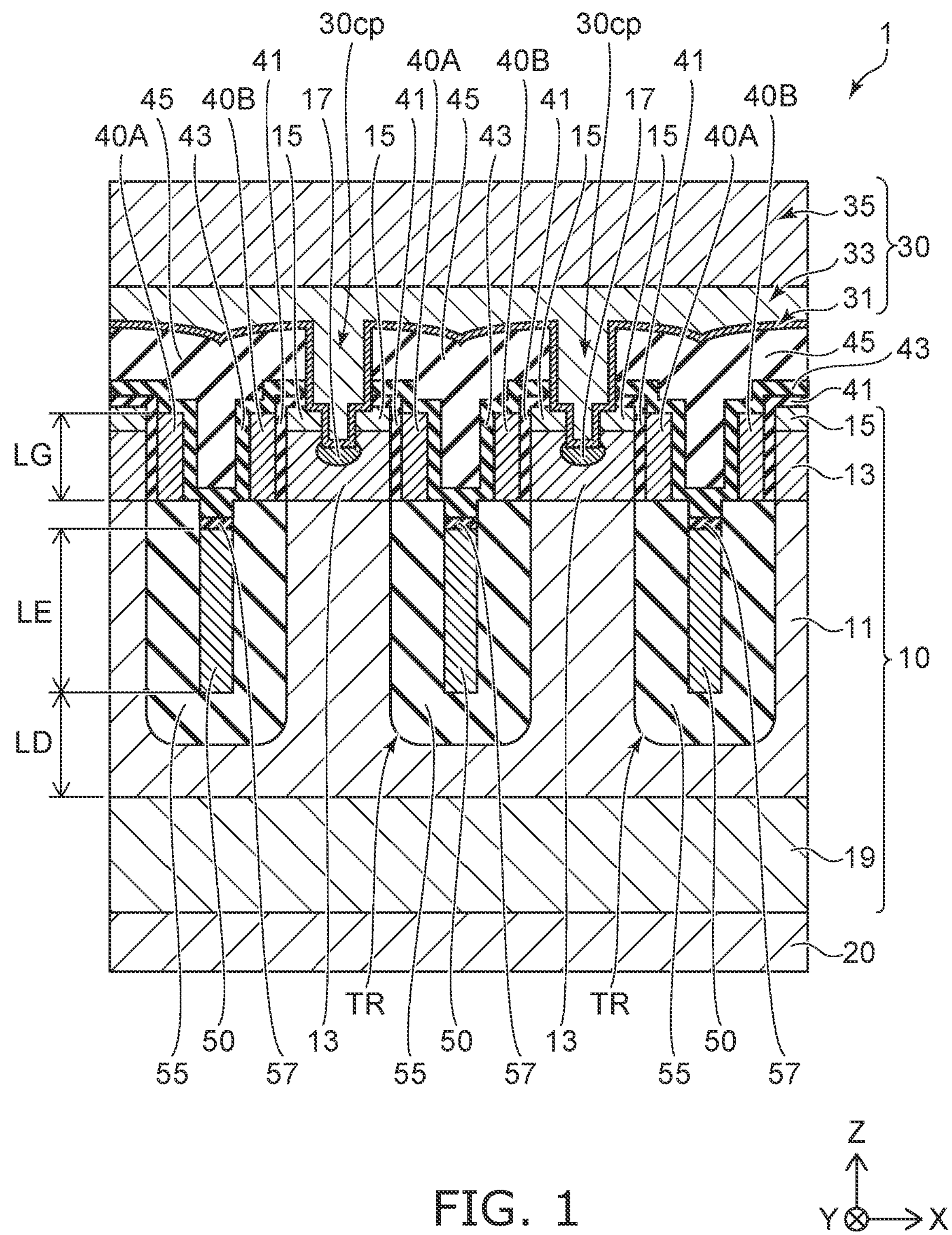
FIG. 1 is a schematic cross-sectional view showing a semiconductor device according to an embodiment.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a MOSFET. The semiconductor device 1 has a trench gate structure. The semiconductor device 1 includes a semiconductor part 10, a first electrode 20, a second electrode 30, a control electrode 40 (referring to FIGS. 2A and 2B), and a third electrode 50. The semiconductor part 10 is, for example, silicon.

The semiconductor part 10 includes, for example, a back surface on which the first electrode 20 is provided, and a front surface at the side opposite to the back surface. The second electrode 30 is provided at the front side of the semiconductor part 10. The first electrode 20 is a drain electrode. The first electrode 20 is provided on the back surface of the semiconductor part 10. The second electrode 30 is a source electrode.

The semiconductor part 10 includes a first semiconductor layer 11 of a first conductivity type, a second semiconductor layer 13 of a second conductivity type, a third semiconductor layer 15 of the first conductivity type, a fourth semiconductor layer 17 of the second conductivity type, and a fifth semiconductor layer 19 of the first conductivity type. For example, the first conductivity type is an n-type; and the second conductivity type is a p-type.

The first semiconductor layer 11 is a so-called drift layer. The first semiconductor layer 11 extends between the first electrode 20 and the second electrode 30.

The second semiconductor layer 13 is a so-called p-type diffusion layer. The second semiconductor layer 13 is provided between the first semiconductor layer 11 and the second electrode 30.

The third semiconductor layer 15 is a so-called n-type source layer. The third semiconductor layer 15 is provided between the second semiconductor layer 13 and the second electrode 30. The third semiconductor layer 15 includes a first-conductivity-type impurity with a higher concentration than the first-conductivity-type impurity concentration in the first semiconductor layer 11, and is electrically connected to the second electrode 30.

The fourth semiconductor layer 17 is a so-called p-type contact layer. The fourth semiconductor layer 17 is provided between the second semiconductor layer 13 and the second electrode 30. The fourth semiconductor layer 17 includes a second-conductivity-type impurity with a higher concentration than the second-conductivity-type impurity in the second semiconductor layer 13, and is electrically connected to the second electrode 30. In the example, the fourth semiconductor layer 17 is provided in the second semiconductor layer 13. The second semiconductor layer 13 is electrically connected to the second electrode 30 via the fourth semiconductor layer 17.

The fifth semiconductor layer 19 is a so-called n-type drain layer. The fifth semiconductor layer 19 is provided between the first semiconductor layer 11 and the first electrode 20. The fifth semiconductor layer 19 includes a first-conductivity-type impurity with a higher concentration than the first-conductivity-type impurity concentration in the first semiconductor layer 11, and is electrically connected to the first electrode 20.

The control electrode 40 is a gate electrode. The control electrode 40 is provided between the first electrode 20 and the second electrode 30. The control electrode 40 is positioned inside a trench TR that is provided in the semiconductor part 10.

The third electrode 50 is a so-called field plate. The third electrode 50 is electrically connected to the source electrode 30. The control electrode 40 and the third electrode 50 are provided inside the trench TR.

As shown in FIG. 1, the control electrode 40 is provided at the same level as a level of the second semiconductor layer 13 in a direction directed from the first electrode 20 toward the second electrode 30 (e.g., the Z-direction). The control electrode 40 includes a first control portion 40A and a second control portion 40B. The first control portion 40A and the second control portion 40B are provided inside the trench TR. The first and second control portions 40A and 40B are arranged in a direction along the boundary between the first semiconductor layer 11 and the second semiconductor layer 13 (e.g., the X-direction).

The trench TR extends in a direction from the second electrode 30 toward the first electrode 20, and has a depth enough to extend into the first semiconductor layer 11 from the front side of the semiconductor part 10. The third electrode 50 is positioned, for example, in the first semiconductor layer 11. The distance from the third electrode 50 to the first electrode 20 is less than the distance from the control electrode 40 to the first electrode 20.

The third electrode 50A has a length LE in the Z-direction. The length LE is greater than a spacing LD between the fifth semiconductor layer 19 and the third electrode 50. Also, the length LE in the Z-direction of the third electrode 50 is greater than a length LG in the Z-direction of the control electrode 40.

As shown in FIG. 1, the semiconductor device 1 further includes a first insulating film 41, a second insulating film 43, a third insulating film 45, a fourth insulating film 55, and a fifth insulating film 57.

The first insulating film 41 is a so-called gate insulating film. The first insulating film 41 is provided between the semiconductor part 10 and the control electrode 40, and electrically insulates the control electrode 40 from the semiconductor part 10. The second semiconductor layer 13 faces the control electrode 40 via the first insulating film 41. The third semiconductor layer 15 contacts the first insulating film 41 between the second semiconductor layer 13 and the second electrode 30.

Multiple trenches TR are provided; and the trenches TR are arranged, for example, in the X-direction. The second semiconductor layer 13 is provided in each region between the multiple trenches TR, and faces the first and second control portions 40A and 40B of the control electrode 40 via the first insulating film 41.

The second insulating film 43 is provided inside the trench TR and covers the first and second control portions 40A and 40B of the control electrode 40.

The third insulating film 45 is provided between the second electrode 30 and the control electrode 40, and electrically insulates the control electrode 40 from the second electrode 30. The third insulating film 45 includes a first portion that is positioned between the second electrode 30 and the first control portion 40A of the control electrode 40, a second portion that is positioned between the second control portion 40B and the second electrode 30, and a third portion that extends between the first control portion 40A and the second control portion 40B. The second insulating film 43 is positioned between the control electrode 40 and the third insulating film 45.

The second insulating film 43 and the third insulating film 45 serves as an inter-layer insulating film that electrically insulates the control electrode 40 from the second electrode 30.

The fourth insulating film 55 is provided between the semiconductor part 10 and the third electrode 50, and electrically insulates the third electrode 50 from the semiconductor part 10. For example, the third electrode 50 is positioned in the first semiconductor layer 11; and the fourth insulating film 55 is positioned between the first semiconductor layer 11 and the third electrode 50.

The fourth insulating film 55, for example, includes the portions that contact the control electrode 40. The portions of the fourth insulating film 55 has a width in the X-direction greater than the width in the X-direction of the first control portion 40A and the width in the X-direction of the second control portion 40B of the control electrode 40. The third insulating film 45 faces the fourth insulating film 55 via the second insulating film 43.

The fifth insulating film 57 is provided between the third electrode 50 and the third portion of the third insulating film 45. The second insulating film 43 includes a portion that is positioned between the fifth insulating film 57 and the third portion of the third insulating film 45. The portion of the second insulating film 43 that is positioned between the fifth insulating film 57 and the third portion of the third insulating film 45 extends between the portion of the fourth insulating film 55 that contacts the first control portion 40A and the portion of the fourth insulating film 55 that contacts the second control portion 40B.

As shown in FIG. 1, the second electrode 30 includes a first metal layer 31, a second metal layer 33, and a third metal layer 35. The first metal layer 31 is provided on the third insulating film 45. The second metal layer 33 and the third metal layer 35 are stacked in this order on the first metal layer 31.

The first metal layer 31 serves as a so-called barrier layer that prevents metal atoms from diffusing into the semiconductor part 10. A contact trench CT (referring to FIG. 12B) that reaches the semiconductor part 10 through the third insulating film 45 is filled with the second metal layer 33. The second metal layer 33 is a so-called buried layer. The third metal layer 35 is a so-called bonding layer and is connected to a conductive body such as a metal wire, etc.

The second electrode 30 includes a contact portion 30*cp* that extends into the semiconductor part 10 from the upper surface of the third insulating film 45. The contact portion 30*cp* is in contact with the third and fourth semiconductor layers 15 and 17 and electrically connected thereto at the inner surface of the contact trench CT (referring to FIG. 12B).

According to an embodiment, the third electrode 50 includes a first end that is at the first electrode 20 side, and a second end that is at the second electrode 30 side. The second end of the third electrode 50 is positioned in the Z-direction, for example, at a level lower than the level of the boundary between the control electrode 40 and the fourth insulating film 55. When viewed from the X-direction, the third electrode 50, for example, does not overlap the control electrode 40. The embodiment is not limited thereto; the second end of the third electrode 50 may be positioned between the first control portion 40A and the second control portion 40B of the control electrode 40.

Figure 2A:
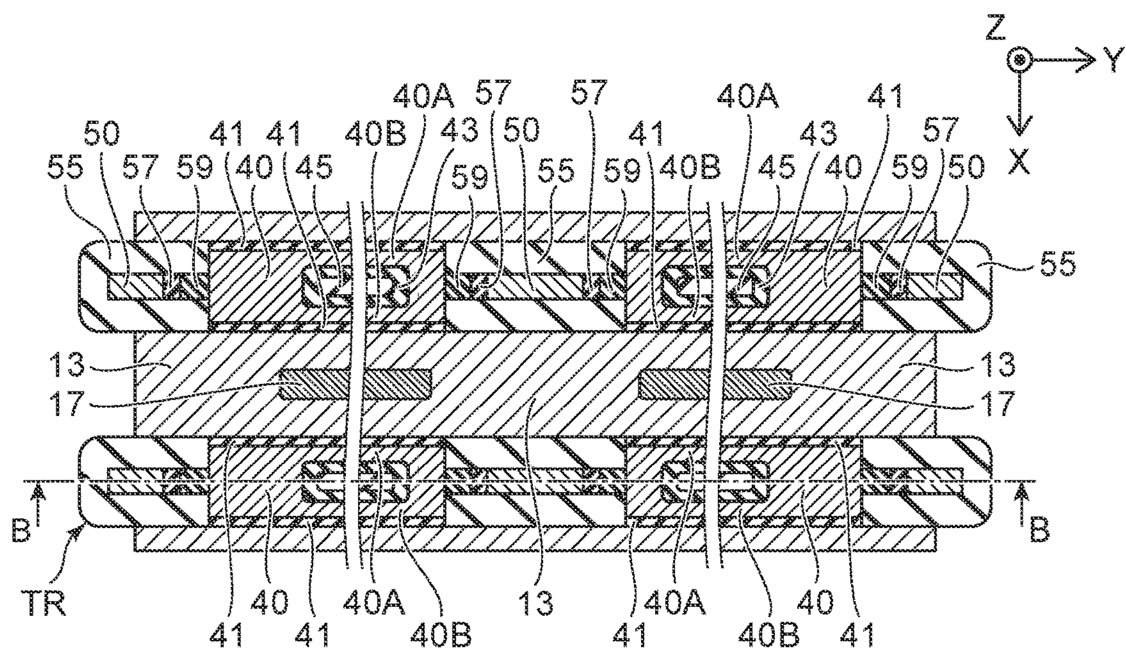
FIGS. 2A and 2B are other schematic cross-sectional views showing the semiconductor device according to the embodiment.
Figure 2B:
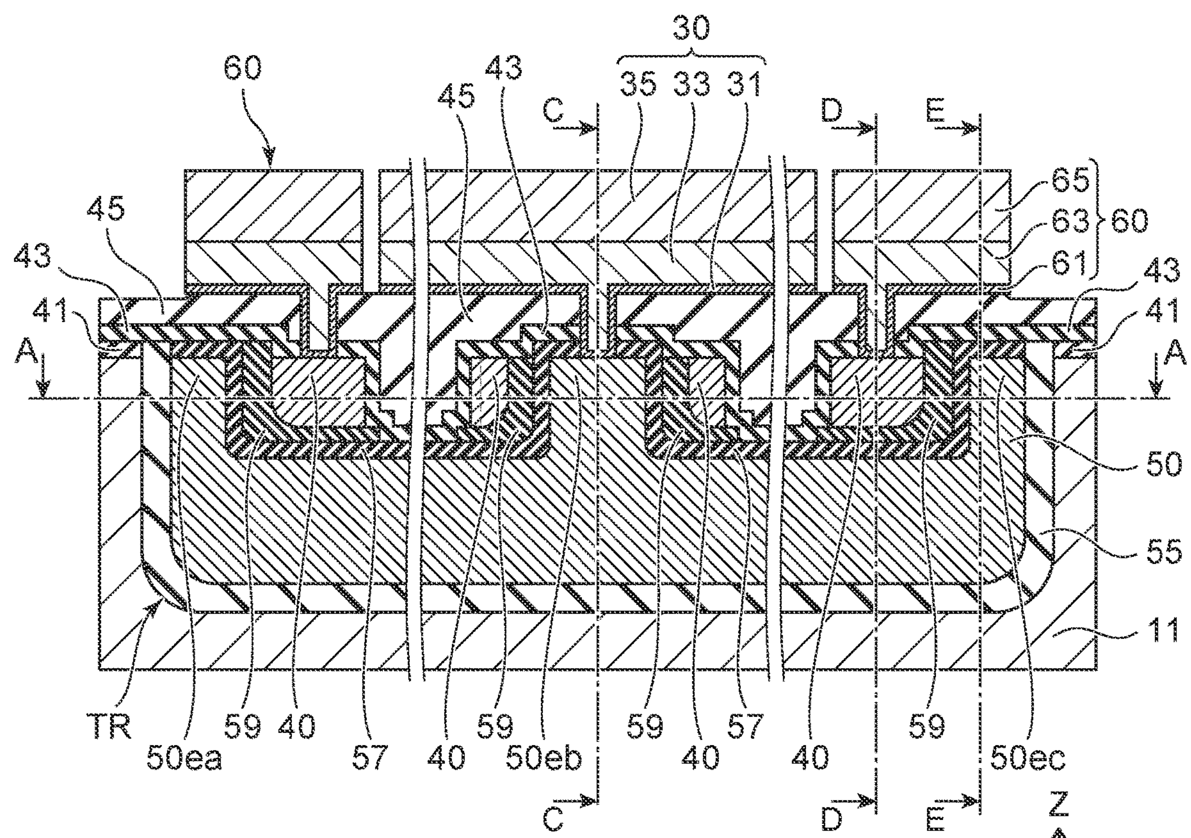

FIGS. 2A and 2B are other schematic cross-sectional views showing the semiconductor device 1 according to the embodiment. FIG. 2A is a cross-sectional view along line A-A shown in FIG. 2B. FIG. 2B is a cross-sectional view along line B-B shown in FIG. 2A.

As shown in FIG. 2A, the trench TR extends in a Y-direction. Multiple control electrodes 40 are provided inside the trench TR; for example, two control electrodes 40 are provided inside the trench TR. The first and second control portions 40A and 40B of the control electrode 40 extend in the Y-direction and are formed to be joined at the ends in the Y-direction of the control electrode 40.

As shown in FIG. 2B, a sixth insulating film 59 is provided between the third electrode 50 and the joined portion of the control electrode 40. The sixth insulating film 59 is provided between the fifth insulating film 57 and the control electrode 40. The sixth insulating film 59 includes a material different from the fifth insulating film 57. The sixth insulating film 59 is, for example, silicate glass that includes boron (B) and phosphorus (P) (i.e., Boron Phosphor Silicate Glass: BPSG).

The third electrode 50 includes extension portions 50*ea*, 50*eb*, and 50*ec* that are positioned, for example, at the same level in the Z-direction as the control electrode 40. The extension portions 50*ea* and 50*ec* are provided respectively at the two ends in the Y-direction of the trench TR. The extension portion 50*eb* is provided between the two control electrodes 40. The third electrode 50 is electrically connected to, for example, the second electrode 30 at the extension portion 50*eb*.

The semiconductor device 1 further includes an interconnect 60. The interconnect 60 is provided on the third insulating film 45. The interconnect 60 is apart from the second electrode 30, and is electrically connected to the control electrode 40. The interconnect 60 is electrically insulated from the second electrode 30.

As shown in FIG. 2B, the interconnect 60 includes a first metal layer 61, a second metal layer 63, and a third metal layer 65. For example, the interconnect 60 has the same stacked structure as the second electrode 30. The first metal layer 61 is a so-called barrier layer. The second metal layer 63 is a so-called buried layer; and the third metal layer 65 is a so-called bonding layer.

Figure 3A:
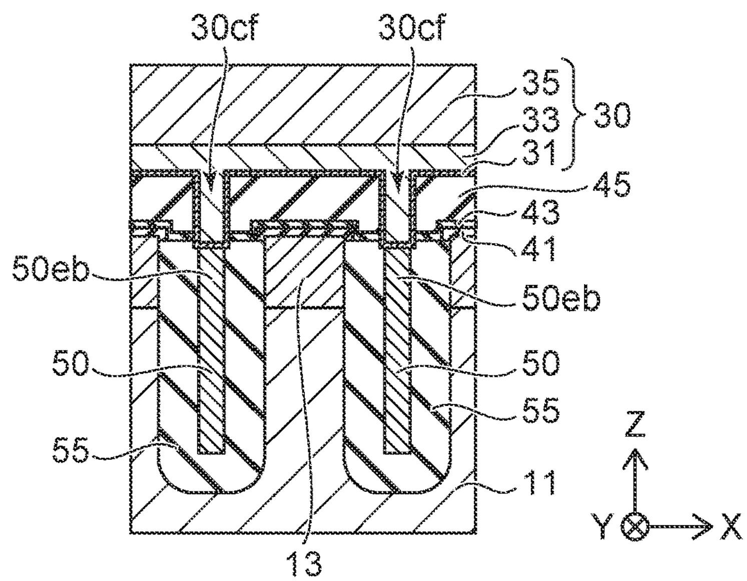
FIGS. 3A to 3C are other schematic cross-sectional views showing the semiconductor device according to the embodiment.
Figure 3B:
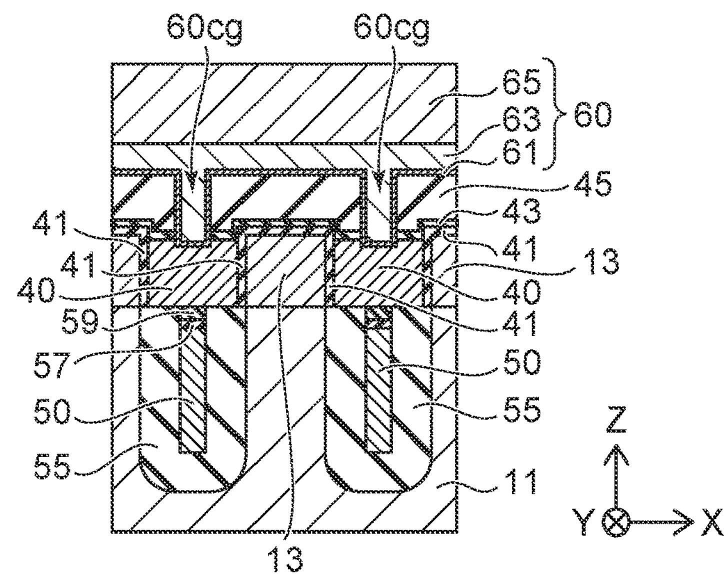
Figure 3C:
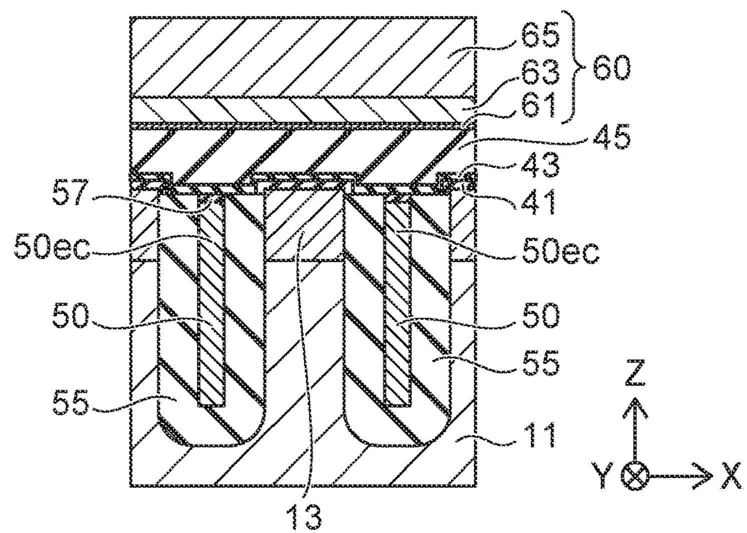

FIGS. 3A to 3C are other schematic cross-sectional views showing the semiconductor device 1 according to the embodiment. FIG. 3A is a cross-sectional view along line C-C shown in FIG. 2B. FIG. 3B is a cross-sectional view along line D-D shown in FIG. 2B. FIG. 3C is a cross-sectional view along line E-E shown in FIG. 2B.

As shown in FIG. 3A, the second electrode 30 further includes a contact portion 30*cf* that extends in the third and second insulating films 45 and 43 and reaches the third electrode 50. The contact portion 30*cf* is in contact with the extension portion 50*eb* of the third electrode 50 and electrically connected thereto. The second electrode 30 is electrically connected to the third electrode 50 via the contact portion 30*cf*.

As shown in FIG. 3B, the interconnect 60 includes a contact portion 60*cg* that extends in the third and second insulating films 45 and 43 and reaches the control electrode 40. For example, the contact portion 60*cg* is in contact with the control electrode 40 and electrically connected thereto at a portion at which the first control portion 40A and the second control portion 40B are joined together.

The fifth insulating film 57 and the sixth insulating film 59 are provided between the control electrode 40 and the third electrode 50. Thus, the spacing between the control electrode 40 and the third electrode 50 can be widened by providing insulating films having a two-layer structure. Therefore, the dielectric strength between the control electrode 40 and the third electrode 50 can be improved, and the parasitic capacitance can be reduced.

As shown in FIG. 3C, the extension portion 50*ec* of the third electrode 50 is not electrically connected to the second electrode 30. The interconnect 60 is provided above the extension portion 50*ec* with the second, third, and fifth insulating films 43, 45, and 57 interposed. The third electrode 50 is electrically insulated from the interconnect 60 by the second, third, and fifth insulating films 43, 45, and 57. The interconnect 60 also is provided above the extension portion 50*ea* of the third electrode 50 with the second, third, and fifth insulating films 43, 45, and 57 interposed (referring to FIG. 2B).

A method for manufacturing the semiconductor device 1 according to the embodiment will now be described with reference to FIGS. 4A to 13B. FIGS. 4A to 13B are schematic cross-sectional views showing manufacturing processes of the semiconductor device 1.

Figure 4A:
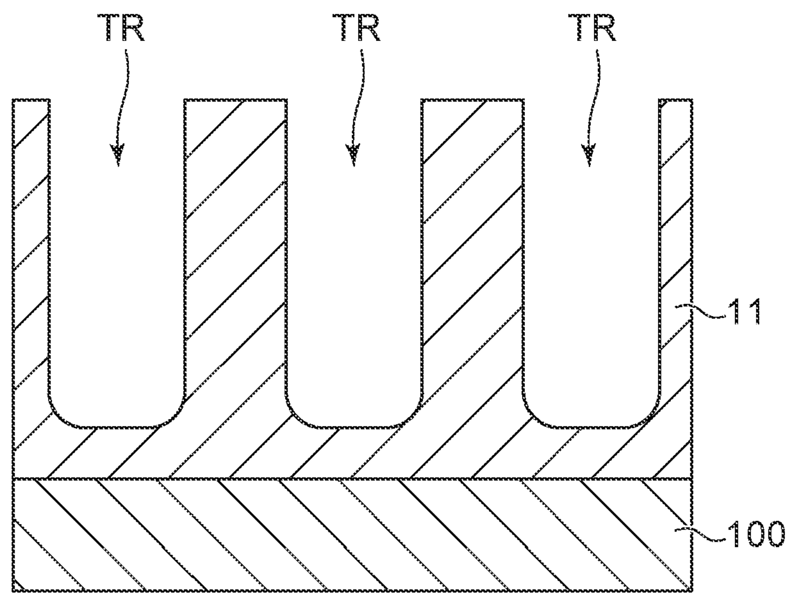
FIGS. 4A to 13B are schematic cross-sectional views showing manufacturing processes of the semiconductor device according to the embodiment.

As shown in FIG. 4A, a semiconductor wafer that includes a semiconductor substrate 100 of the first conductivity type and the first semiconductor layer 11 is prepared. The semiconductor substrate 100 is, for example, an n-type silicon substrate. The first semiconductor layer 11 is, for example, an n-type silicon layer that is epitaxially grown on the semiconductor substrate 100. The first semiconductor layer 11 includes a first-conductivity-type impurity with a lower concentration than the first-conductivity-type impurity concentration in the semiconductor substrate 100.

Then, the trench TR is formed in the first semiconductor layer 11. The trench TR is formed by, for example, selectively etching the first semiconductor layer 11. The first semiconductor layer 11 is selectively removed by using anisotropic RIE (Reactive Ion Etching) and an etching mask (not illustrated).

Figure 4B:
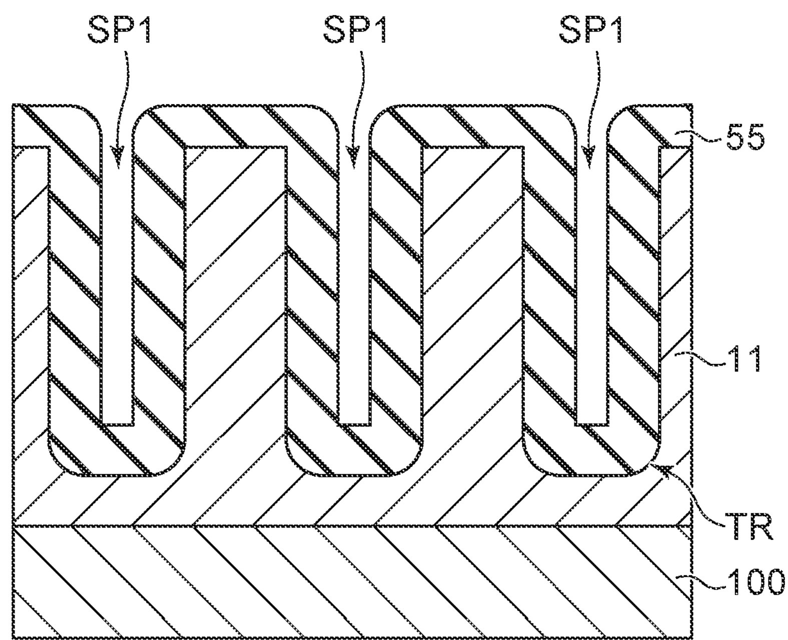

As shown in FIG. 4B, the fourth insulating film 55 is formed on the first semiconductor layer 11. The fourth insulating film 55 covers the inner surface of the trench TR. The fourth insulating film 55 is formed so that a first space SP1 remains inside the trench TR. For example, the fourth insulating film 55 is formed using CVD (Chemical Vapor Deposition). The fourth insulating film 55 is, for example, a silicon oxide film.

The fourth insulating film 55 may have a two-layer structure that includes a silicon oxide film formed by thermal oxidation of the first semiconductor layer 11 and another silicon oxide film formed using CVD.

Figure 5A:
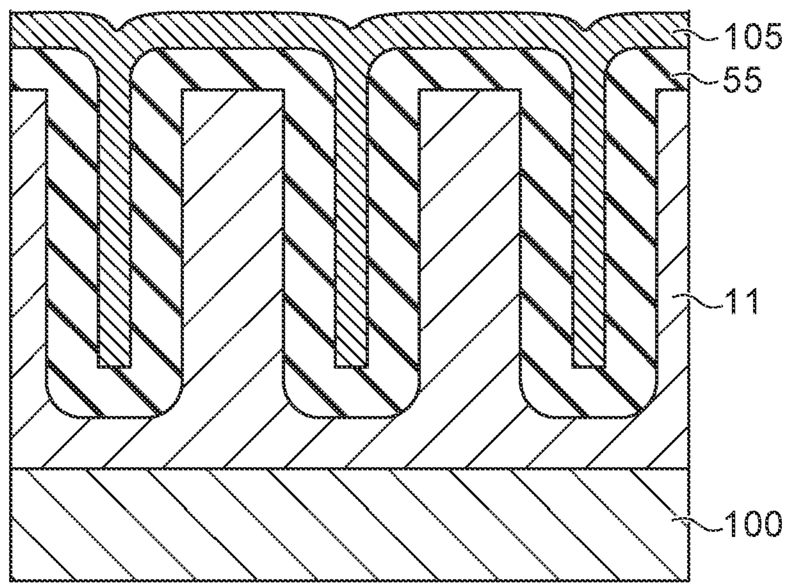

As shown in FIG. 5A, a conductive film 105 is formed on the fourth insulating film 55. The conductive film 105 is formed to fill the first space SP1 (referring to FIG. 4B). The conductive film 105 is, for example, a polysilicon film. The conductive film 105 is formed to be conductive, for example, by using CVD.

Figure 5B:
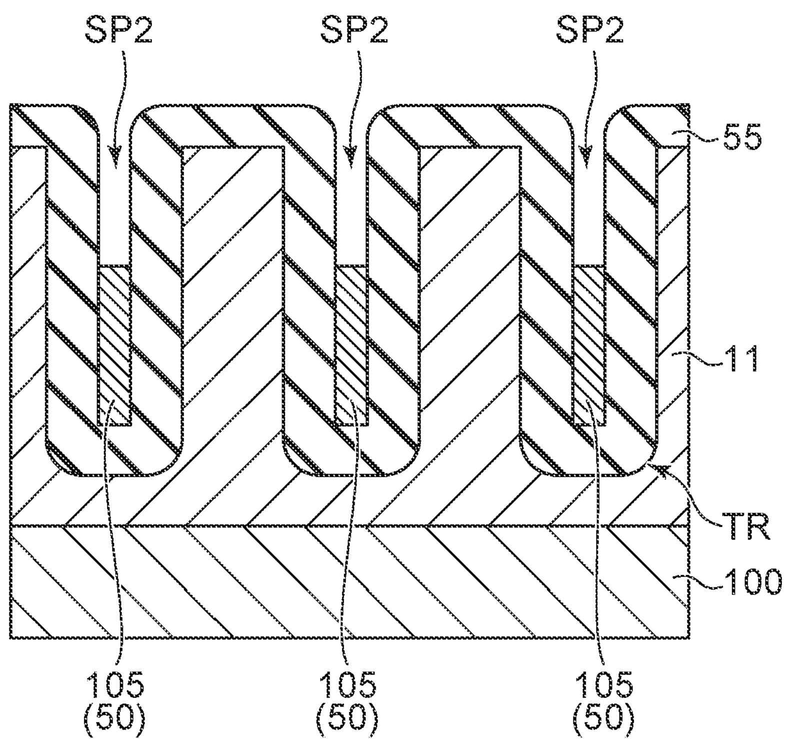

As shown in FIG. 5B, the conductive film 105 is etched so that a portion of the conductive film 105 remains in the trench TR. The conductive film 105 is removed by, for example, wet etching. The portion of the conductive film 105 that remains in the trench TR is the third electrode 50. A second space SP2 is formed on the third electrode 50 in the trench TR.

The conductive film 105 is removed so that the extension portions 50*ea*, 50*eb*, and 50*ec* of the third electrode 50 remain (referring to FIG. 2B) in the trench TR. That is, the portion that remains in the trench TR is selectively removed using an etching mask (not illustrated) after other portions formed on the first semiconductor layer 11 is removed.

Figure 6A:
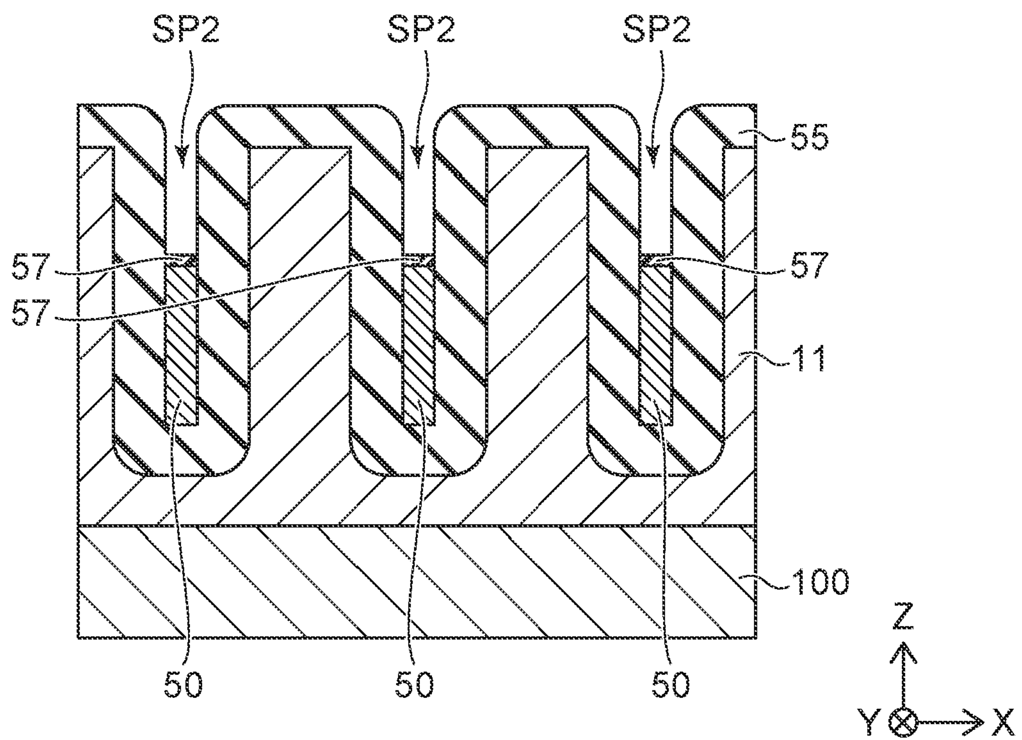

As shown in FIG. 6A, the fifth insulating film 57 is formed on the third electrode 50. For example, the third electrode 50 is thermally oxidized via the second space SP2 to form the fifth insulating film 57. The fifth insulating film 57 is, for example, a silicon oxide film.

Figure 6B:
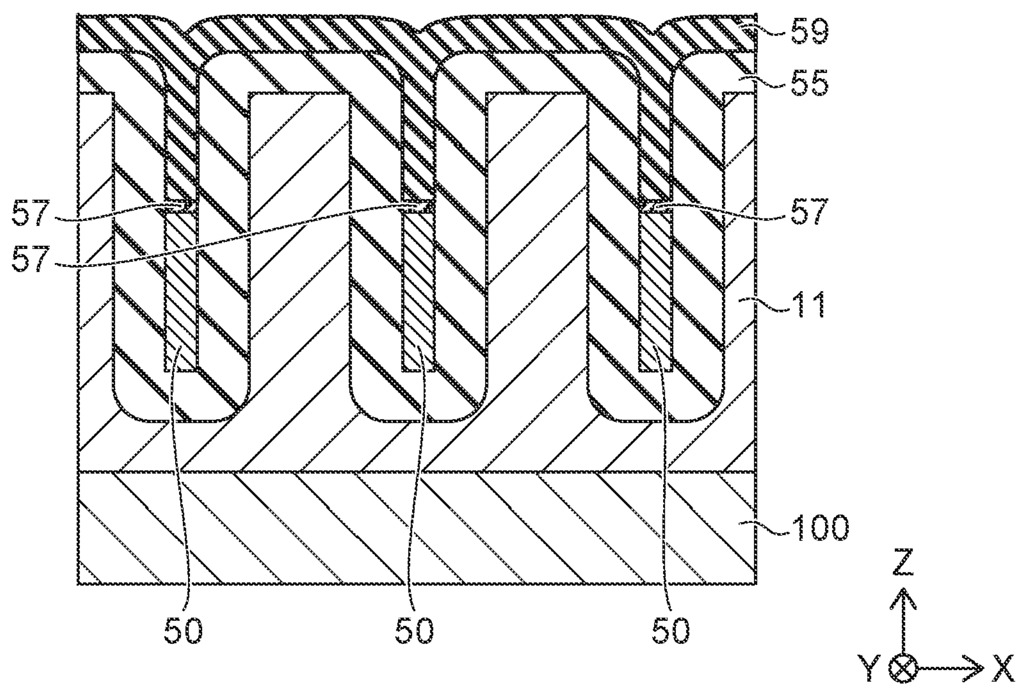

As shown in FIG. 6B, the sixth insulating film 59 is formed on the fourth and fifth insulating films 55 and 57.

The second space SP2 is filled with the sixth insulating film 59. The sixth insulating film 59 is formed, for example, using CVD.

The sixth insulating film 59 is, for example, BPSG. By using BPSG as the sixth insulating film 59, the second space SP2 may be uniformly filled. For example, BPSG has a softening point of not more than 1000° C. Therefore, BPSG can be softened by heat treatment; and the second space SP2 may be filled with the sixth insulating film 59 without seams, voids, etc.

Figure 7A:
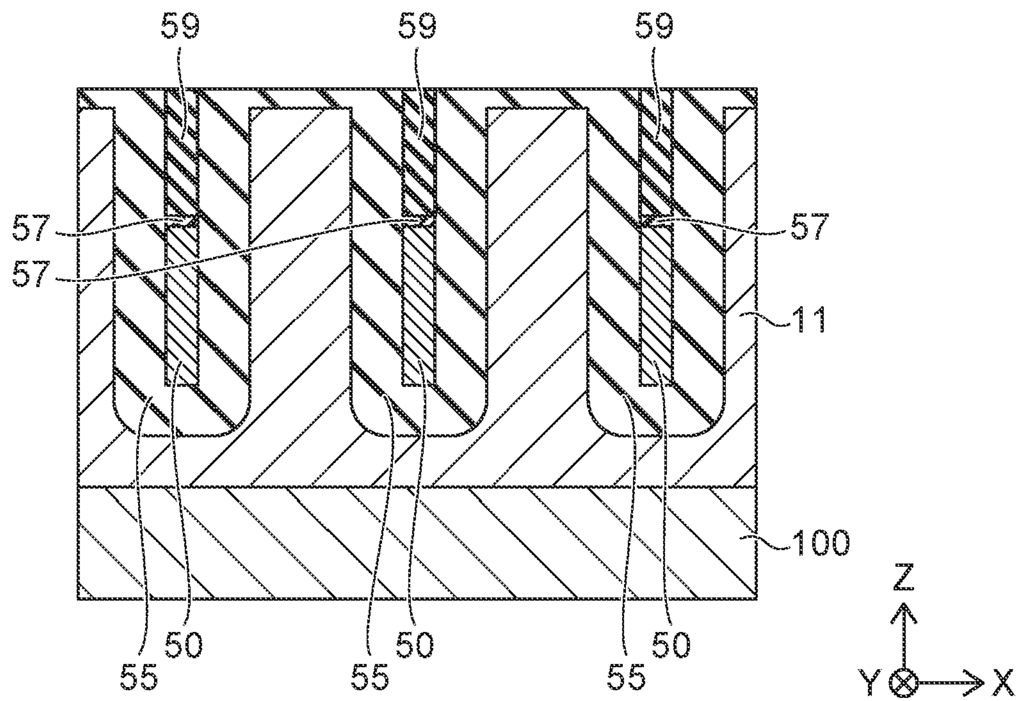

As shown in FIG. 7A, the sixth insulating film 59 is removed so that the portion that fills the second space SP2 remains. The sixth insulating film 59 is removed using, for example, CMP (Chemical Mechanical Polishing). At this time, the fourth insulating film 55 serves as a CMP stopper.

Figure 7B:
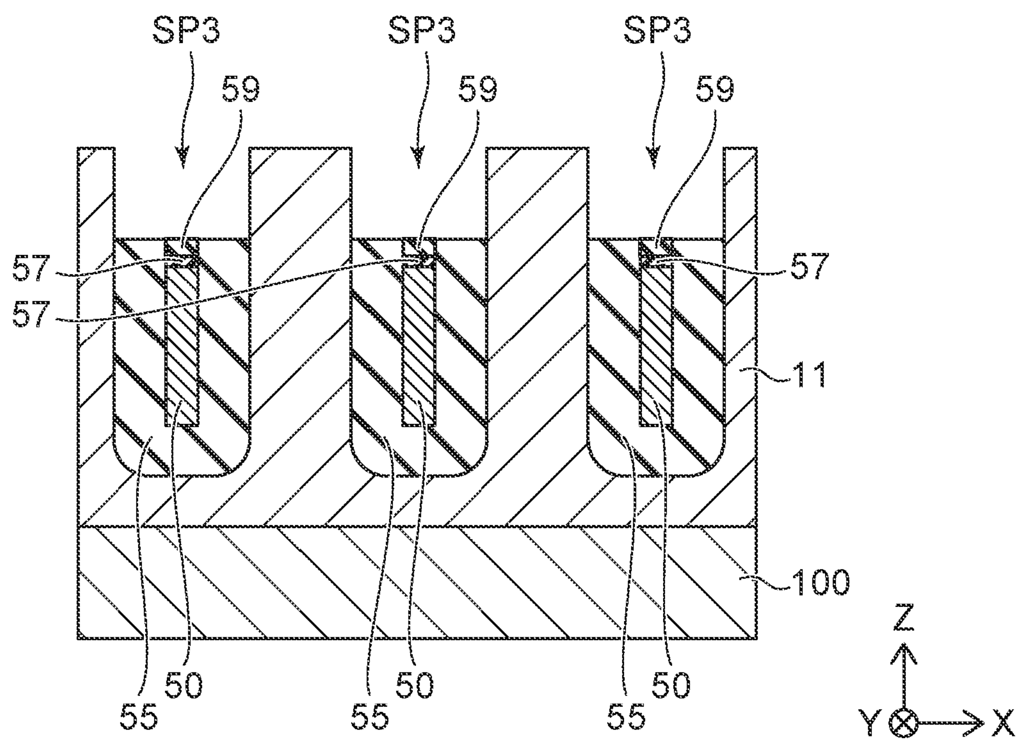

As shown in FIG. 7B, a third space SP3 is formed in the upper portion of the trench TR. The third space SP3 is formed by, for example, partially removing the fourth insulating film 55 and the sixth insulating film 59 by using isotropic dry etching (referring to FIG. 7B).

For example, if the seams and/or voids remain in the sixth insulating film 59, it is difficult to uniformly etch the fourth insulating film 55 and the sixth insulating film 59. Therefore, it is also difficult to control the depth of the third space SP3. According to the embodiment, BPSG used as the sixth insulating film 59 may eliminate the seams and/or voids, and makes the etching control easier. The third space SP3 is formed to expose the first semiconductor layer 11.

Figure 8A:
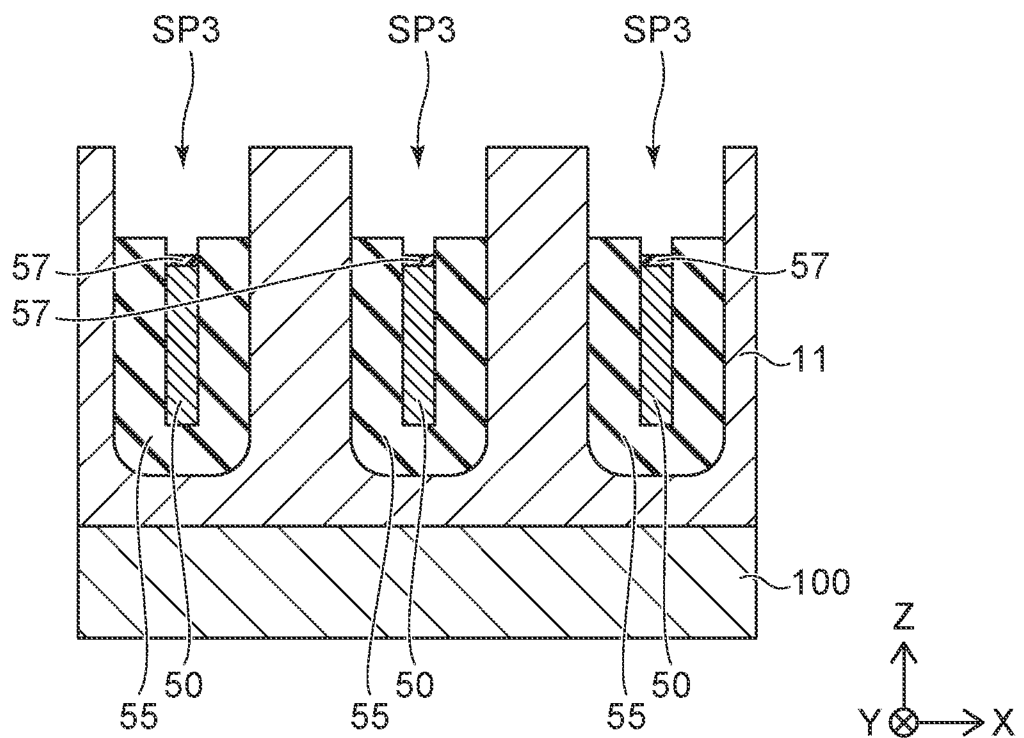

As shown in FIG. 8A, the sixth insulating film 59 that remains on the fifth insulating film 57 is removed. The sixth insulating film 59 is removed by, for example, wet etching. The sixth insulating film 59 can be selectively removed by using, for example, a diluted fluid of hydrofluoric acid as the etchant. The fourth insulating film 55 and the fifth insulating film 57 are exposed at the bottom surface of the third space SP3. Also, the sixth insulating film 59 is selectively removed using an etching mask (not-illustrated) so that a portion of the sixth insulating film 59 remains at the end of the third space SP3 positioned in the extension direction (the Y-direction) of the trench TR (referring to FIG. 2B).

Figure 8B:
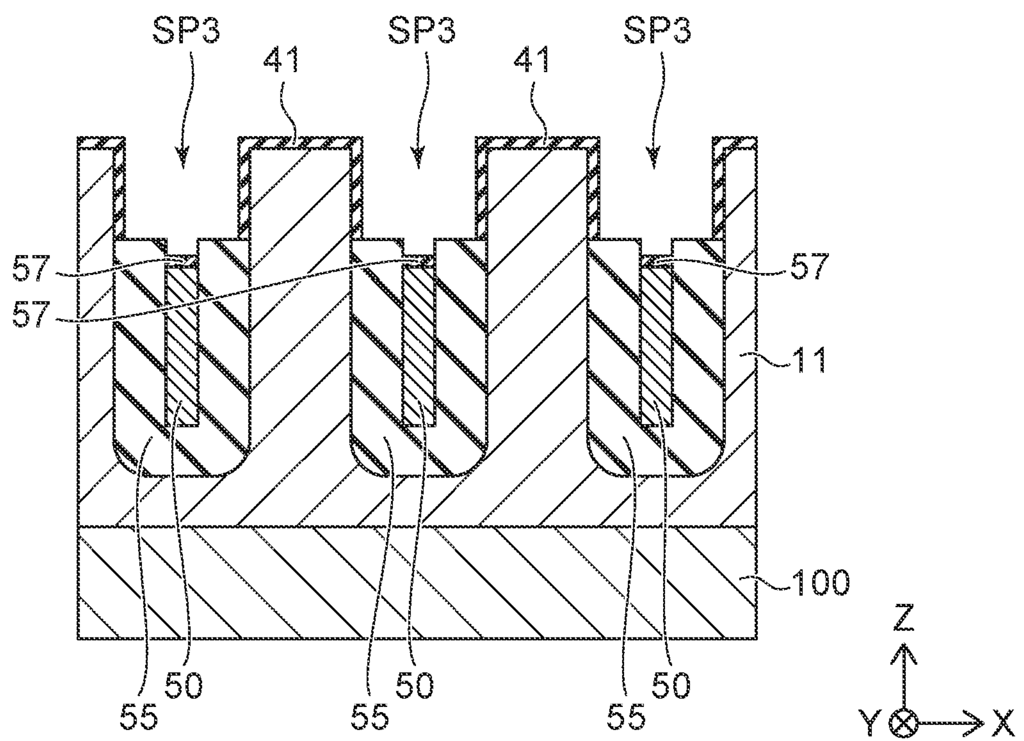

As shown in FIG. 8B, the first insulating film 41 is formed on the first semiconductor layer 11. The first semiconductor layer 11 is, for example, thermally oxidized to form the first insulating film 41. The first insulating film 41 is, for example, a silicon oxide film. Also, in the process of forming the first insulating film 41 by the thermal oxidation, the third electrode 50 also is oxidized, and the thickness of the fifth insulating film 57 is increased in the Z-direction.

For example, when the sixth insulating film 59 is BPSG, boron and/or phosphorus thereof diffuses into unintended portions through the thermal oxidation process that forms the first insulating film 41. Such impurity diffusion may be avoided by selectively removing the sixth insulating film 59 in the process shown in FIG. 8A.

Figure 9A:
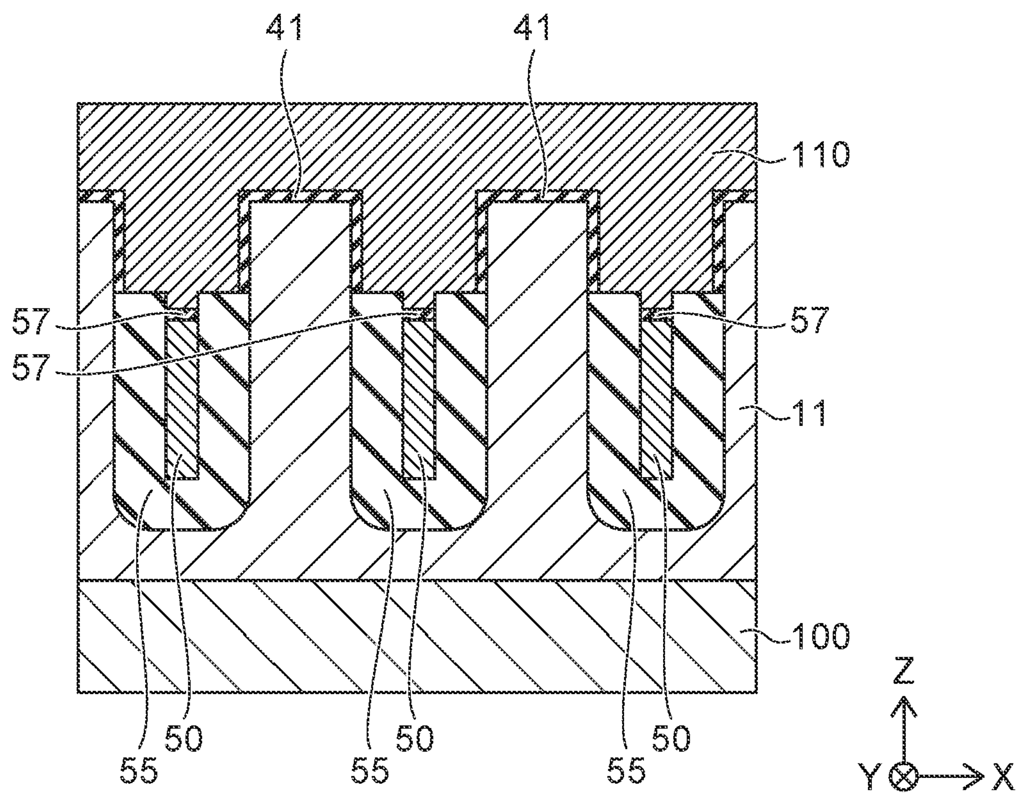

As shown in FIG. 9A, a conductive film 110 is formed to fill the third space SP3. The conductive film 110 is, for example, a polysilicon film that includes a first-conductivity-type impurity such as phosphorus (P), arsenic (As), etc. The conductive film 110 is formed using CVD, for example. The conductive film 110 may be formed to be conductive by, for example, doping the first-conductivity-type impurity in a CVD process. Alternately, the conductive film 110 may be formed by diffusing the first-conductivity-type impurity into polysilicon after the un-doped polysilicon film is formed by the CVD.

Figure 9B:
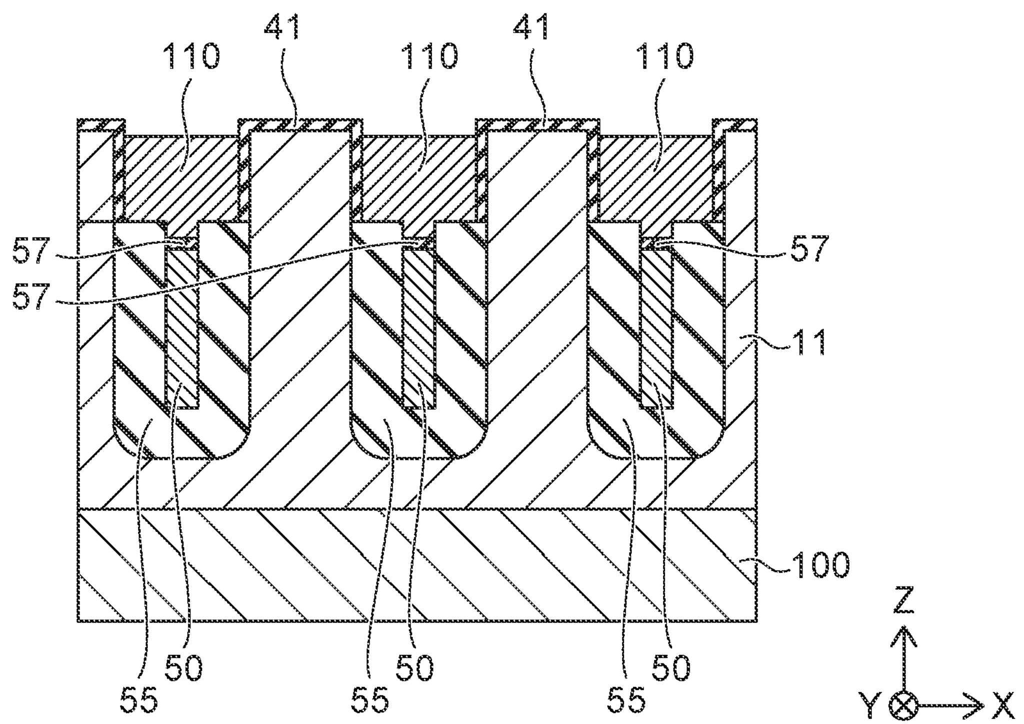

As shown in FIG. 9B, the conductive film 110 is removed so that the third space SP3 is filled with the remaining portion. The conductive film 110 is removed using CMP, for example. The first insulating film 41 serves as a CMP stopper at the upper surface of the first semiconductor layer 11.

Figure 10A:
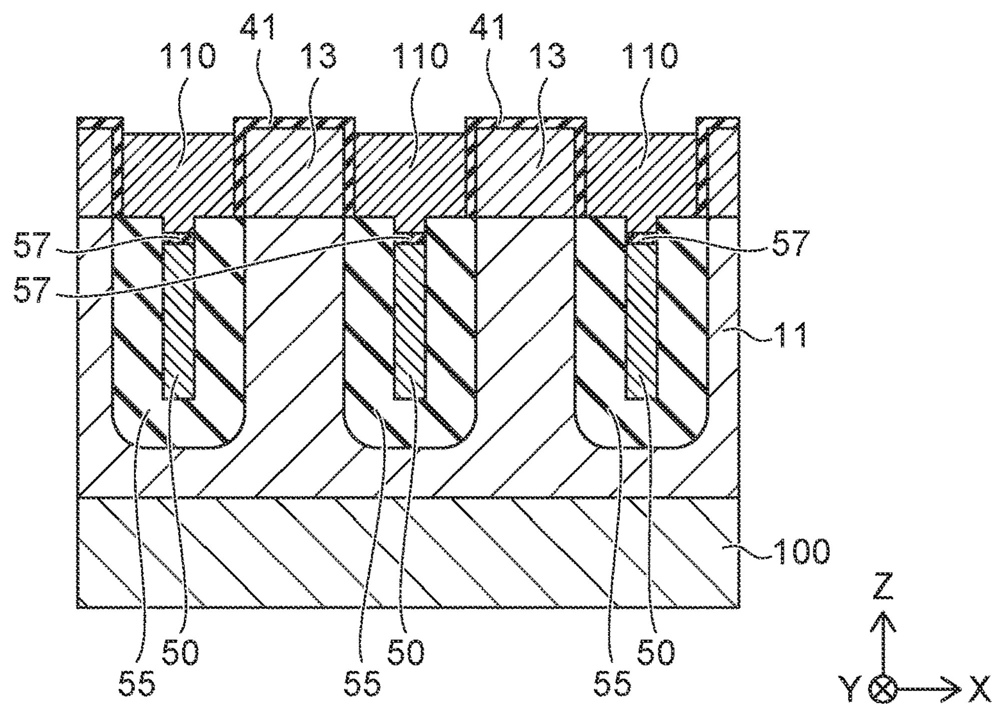

As shown in FIG. 10A, the second semiconductor layer 13 is formed on the first semiconductor layer 11. The second semiconductor layer 13 is formed by ion implantation through the first insulating film 41 provided on the first semiconductor layer 11. The implanted second-conductivity-type impurity is activated and diffused by heat treatment. For example, boron (B) is ion-implanted into the first semiconductor layer 11 as the second-conductivity-type impurity. The boundary between the first semiconductor layer 11 and the second semiconductor layer 13 is provided at a level higher in the Z-direction than a level of the boundary between the fourth insulating film 55 and the conductive film 110.

Figure 10B:
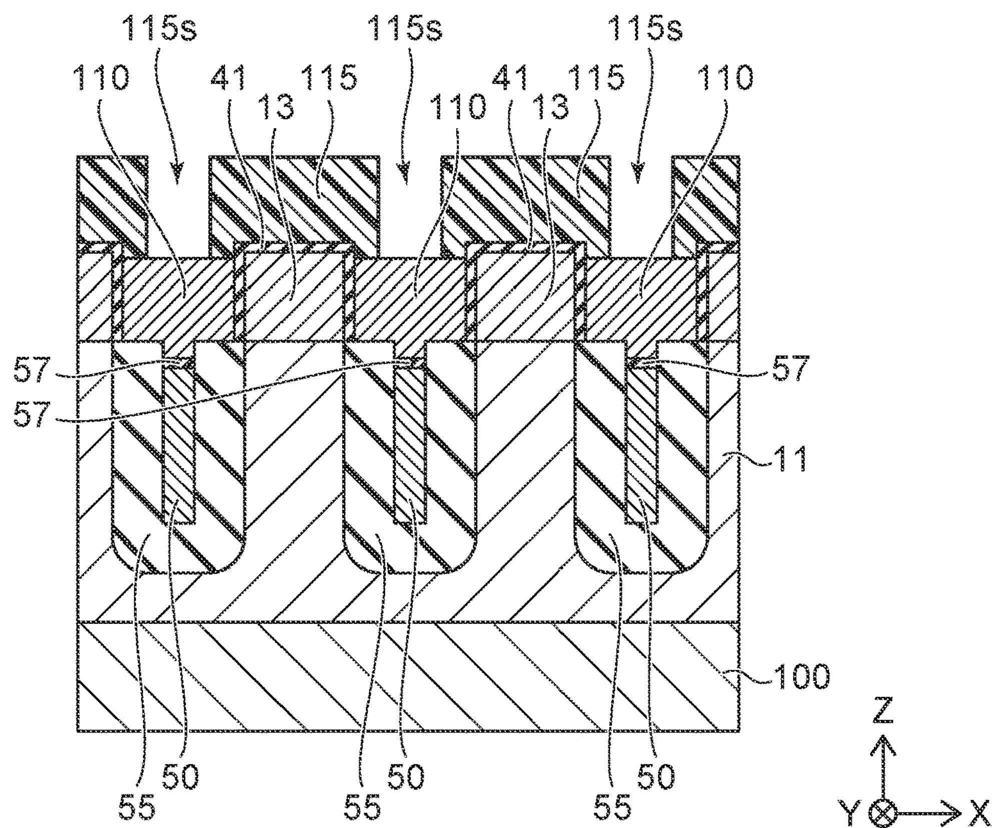

As shown in FIG. 10B, an etching mask 115 is formed on the second semiconductor layer 13 and the conductive film 110. The etching mask 115 has an opening 115*s* on the conductive film 110. The etching mask 115 is formed using, for example, photolithography.

Figure 11A:
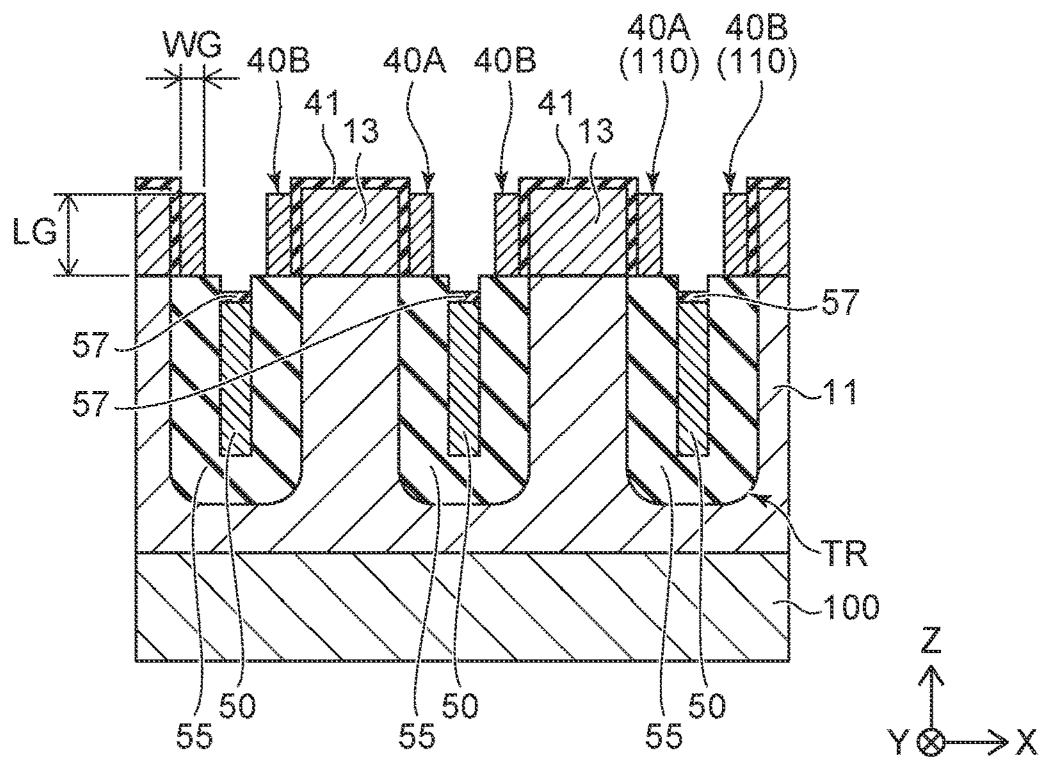

As shown in FIG. 11A, the first and second control portions 40A and 40B of the control electrode 40 are formed in the trench TR. The first control portion 40A and the second control portion 40B are formed by selectively etching the conductive film 110. The conductive film 110 is selectively removed by, for example, wet etching using the etching mask 115. The fourth insulating film 55 and the fifth insulating film 57 are exposed in the space between the first control portion 40A and the second control portion 40B.

The first control portion 40A and the second control portion 40B each are formed to have flat upper surfaces. The lengths LG in the Z-direction of the first and second control portions 40A and 40B are, for example, 0.4 to 1.5 micrometers (μm). Widths WG in the X-direction of the first and second control portions 40A and 40B are, for example, 0.1 to 0.5 μm.

Figure 11B:
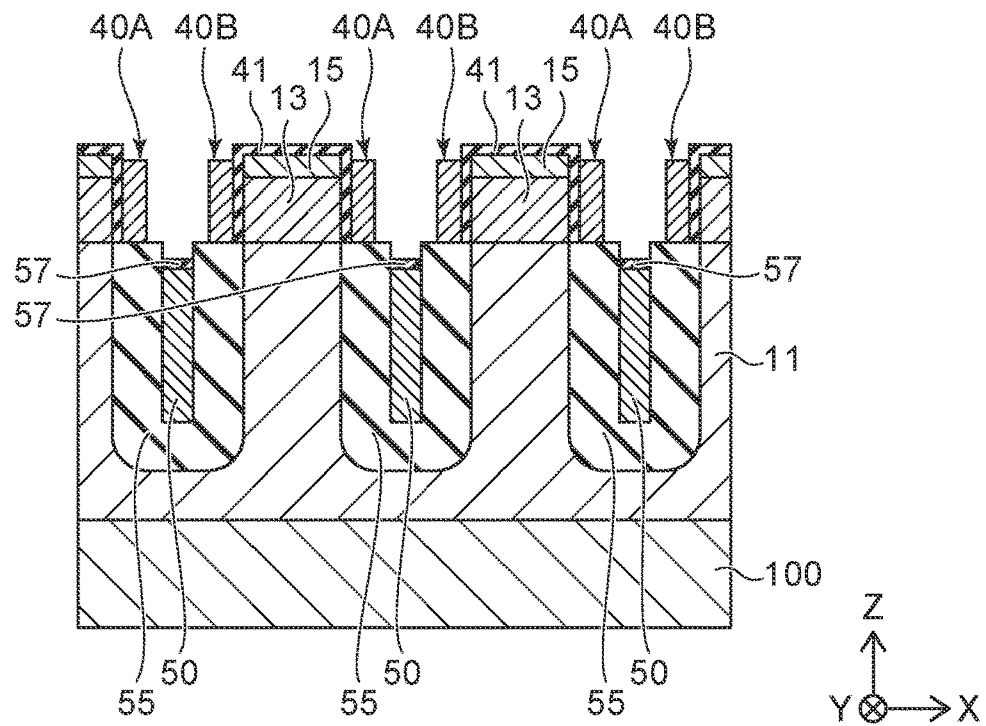

As shown in FIG. 11B, the third semiconductor layer 15 is formed on the second semiconductor layer 13. For example, the third semiconductor layer 15 is formed by ion-implanting a first-conductivity-type impurity such as phosphorus (P) or the like into the second semiconductor layer 13 through the first insulating film 41. The ion-implanted impurity is activated by heat treatment.

Figure 12A:
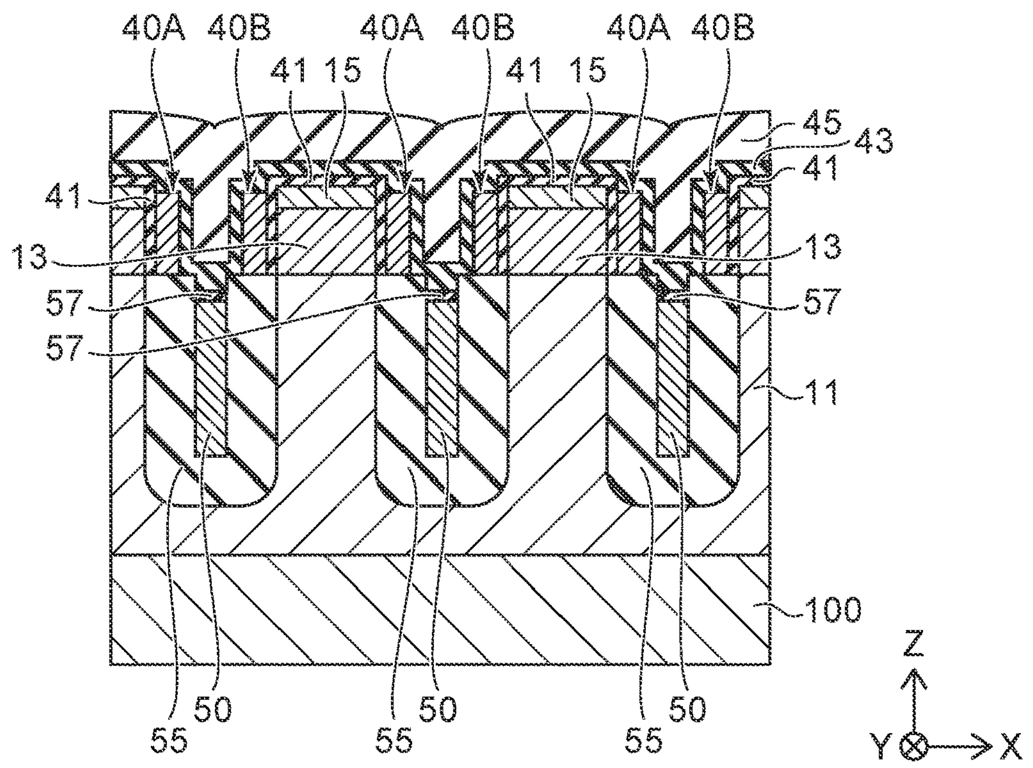

As shown in FIG. 12A, the second insulating film 43 and the third insulating film 45 are formed on the control electrode 40 and the first insulating film 41. The second insulating film 43 covers the first and second control portions 40A and 40B of the control electrode 40 and covers the fourth insulating film 55 and the fifth insulating film 57 that are exposed in the space between the first control portion 40A and the second control portion 40B. The second insulating film 43 also covers the third semiconductor layer 15 with the first insulating film 41 interposed. The second insulating film 43 is, for example, a silicon oxide film and is formed using CVD.

The third insulating film 45 is formed on the second insulating film 43. The space between the first control portion 40A and the second control portion 40B is filled with the third insulating film 45. The third insulating film 45 includes a portion that extends between the first control portion 40A and the second control portion 40B. The third insulating film 45 is, for example, BPSG. The third insulating film 45 is formed using CVD, for example.

Figure 12B:
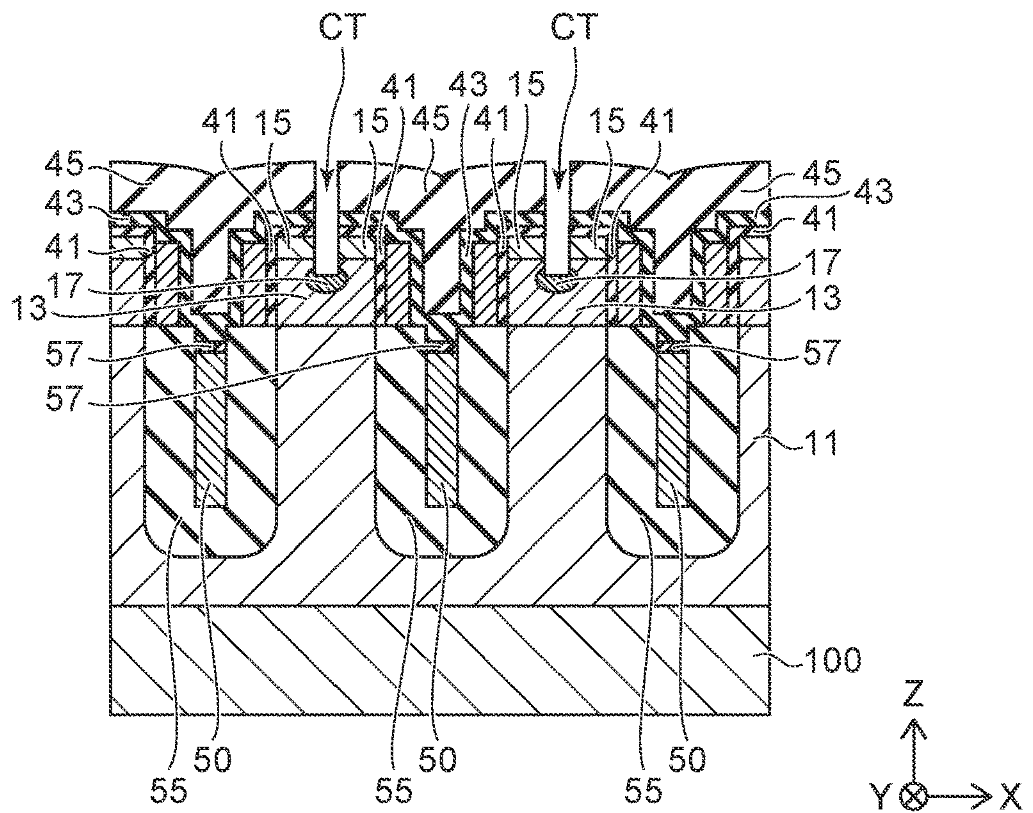

As shown in FIG. 12B, a contact trench CT that extends into the second semiconductor layer 13 from the upper surface of the third insulating film 45 is formed. The contact trench CT is formed by selectively etching the third insulating film 45, the second insulating film 43, the first insulating film 41, and the third semiconductor layer 15 by using, for example, anisotropic RIE and an etching mask (not-illustrated). The contact trench CT is formed to have a bottom surface, for example, in the second semiconductor layer 13.

The fourth semiconductor layer 17 is formed in the second semiconductor layer 13. The fourth semiconductor layer 17 is formed by ion-implanting a second-conductivity-type impurity such as boron (B) or the like into the second semiconductor layer 13 via the contact trench CT. The ion-implanted impurity is activated by heat treatment. The fourth semiconductor layer 17 is, for example, separated from the third semiconductor layer 15. Alternatively, the fourth semiconductor layer 17 may be linked to the third semiconductor layer 15.

Figure 13A:
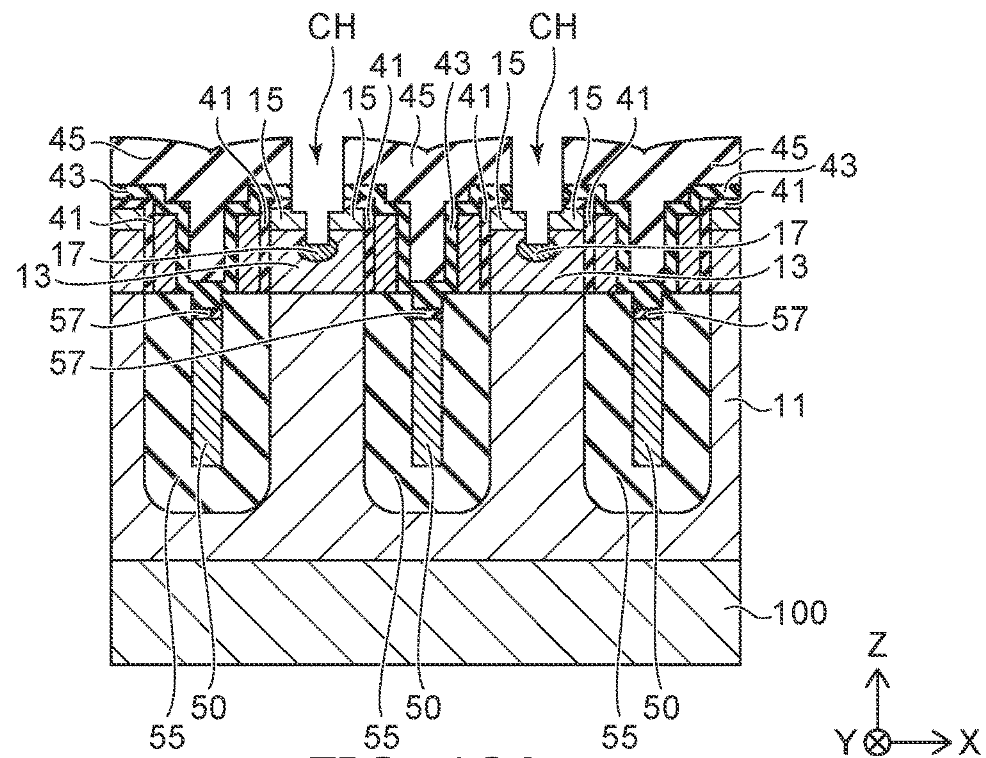

As shown in FIG. 13A, for example, the contact trench CT is enlarged in the X-direction. A portion of the upper surface of the third semiconductor layer 15 is exposed thereby. The contact trench CT is enlarged by, for example, etching the first insulating film 41, the second insulating film 43 and the third insulating film 45 that are on the third semiconductor layer 15.

Figure 13B:
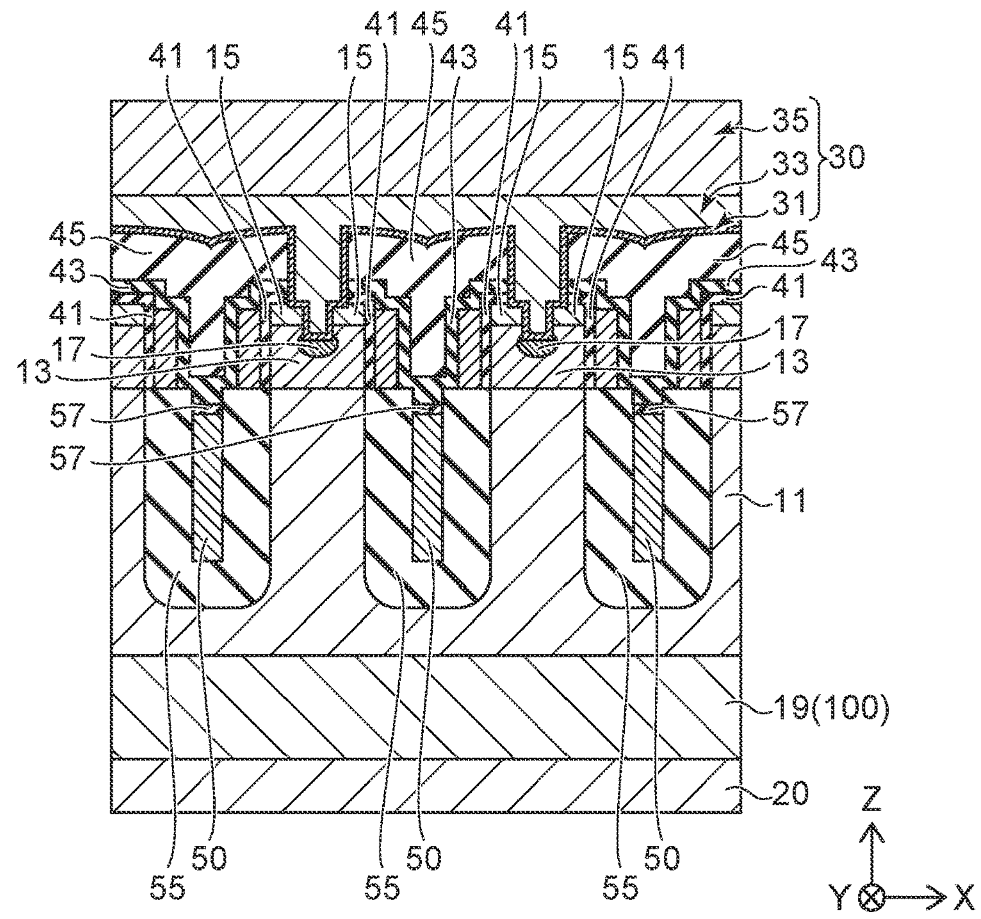

As shown in FIG. 13B, the second electrode 30 is formed on the third insulating film 45. The second electrode 30 includes the first metal layer 31, the second metal layer 33 and the third metal layer 35. The contact trench CT is filled with the second electrode 30.

The first metal layer 31 covers the upper surface of the third insulating film 45 and the inner surface of the contact trench CT. The first metal layer 31 is, for example, a titanium nitride layer (TiN). The first metal layer 31 is formed using, for example, reactive sputtering.

The second metal layer 33 is formed on the first metal layer 31. The contact trench CT is filled with the second metal layer 33. The second metal layer 33 is, for example, a tungsten layer (W). The second metal layer 33 is formed using, for example, CVD.

The third metal layer 35 is formed on the second metal layer 33. The third metal layer 35 is, for example, an aluminum layer (Al). The third metal layer 35 is formed using, for example, sputtering.

Then, the semiconductor substrate 100 is thinned to form the fifth semiconductor layer 19 with a prescribed thickness by polishing at the backside thereof. The first electrode 20 is formed on the back surface of the fifth semiconductor layer 19; and the semiconductor device 1 is completed. The first electrode 20 is, for example, a metal layer that includes nickel, aluminum, etc.

The manufacturing method described above is an example; and the embodiments are not limited thereto. For example, the third insulating film 45 may be a silicon oxide film.

The first insulating film 41, the second insulating film 43, and the third insulating film 45 are, for example, silicon oxide films made by different manufacturing methods. The first insulating film 41 is formed by, for example, the thermal oxidation. The thermally oxidized film has a high film density and the fewest dangling bonds of silicon. The second insulating film 43 and the third insulating film 45 each are formed using one of CVD, HDP (High Density Plasma), or HARP (High Aspect Ratio Process). In the silicon oxide films made by such manufacturing methods, the dangling bonds of silicon are terminated with hydrogen atoms. Thus, the second insulating film 43 and the third insulating film 45 may have a lower film density than that of a silicon oxide film formed by thermal oxidation. As a result, the first insulating film 41, the second insulating film 43, and the third insulating film 45 are silicon oxide films that have mutually-different film densities.

For example, the film density of the second insulating film 43 is less than the film density of the first insulating film 41 and greater than the film density of the third insulating film 45. Alternatively, the film density of the third insulating film 45 may be less than the film density of the first insulating film 41, equal to the film density of the second insulating film 43, or greater than the film density of the second insulating film 43. The difference of the "film density" can be detected using, for example, RBS (Rutherford Backscattering), XRR (X-ray Reflection), etc. The "film density" difference also can be detected using the contrast difference of a HAADF-STEM (High Angle Annular Dark-Field Scanning Transmission Electron Microscopy) image.

When a BPSG film is used as the third insulating film 45, mobile ions, e.g., sodium (Na) in the silicon oxide film may be gathered (or trapped) by the third insulating film 45; and thereby, the reliability of the semiconductor device 1 is increased.

The fourth insulating film 55 is formed to be thick so that a high breakdown voltage is obtained at the bottom of the trench TR that is proximate to the first electrode 20. When the fourth insulating film 55 is formed by thermal oxidation, for example, the wafer warp due to the stress in the film is increased as the thickness of the fourth insulating film 55 increases. To avoid the wafer warp, for example, a silicon oxide film formed by CVD may be preferably used as the fourth insulating film 55, or silicon oxide films that are formed by thermal oxidation and by CVD are stacked in the two-layer structure. The silicon oxide film that is formed using CVD, however, includes Na ions; and the amount of Na included in the film increases as the film thickness increases.

The semiconductor device 1 according to the embodiment may include BPSG film as the third insulating film 45 that extends between the first control portion 40A and the second control portion 40B of the control electrode 40. The BPSG film is proximate to the fourth insulating film 55 with the second insulating film 43 interposed. Therefore, the gettering efficiency of the Na ions by the BPSG film may be increased, and the movement of Na ions from the fourth insulating film 55 into the gate insulating film can be suppressed. As a result, the characteristic fluctuation of the semiconductor device 1 can be suppressed, and the reliability can be increased.

Figure 14A:
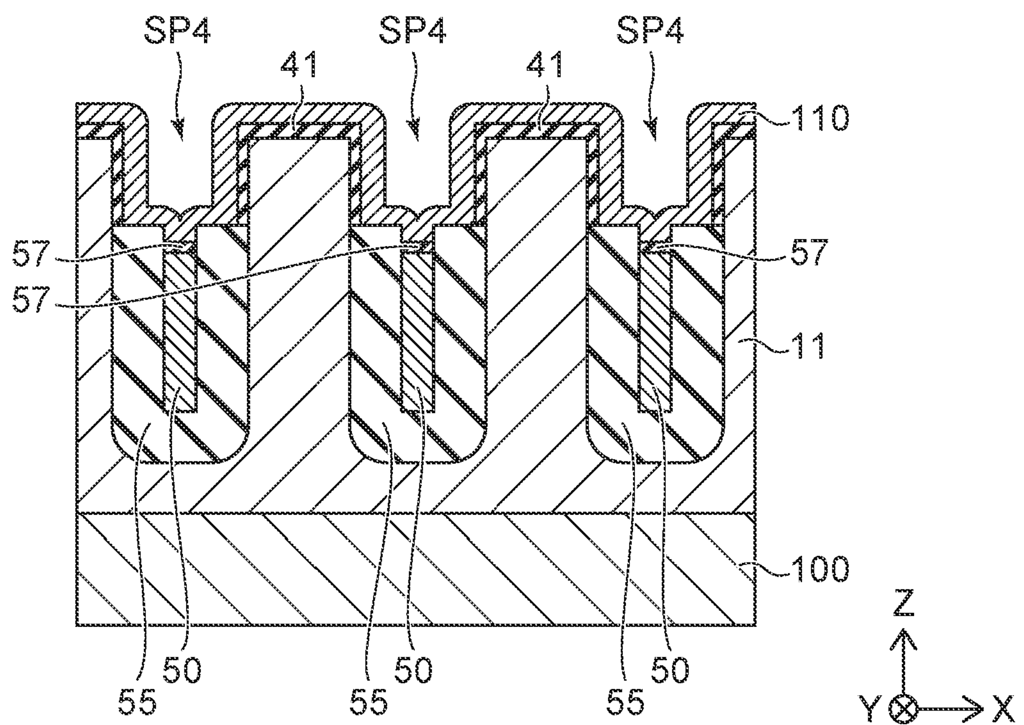
FIGS. 14A and 14B are schematic cross-sectional views showing a manufacturing method according to a modification of the embodiment.
Figure 14B:
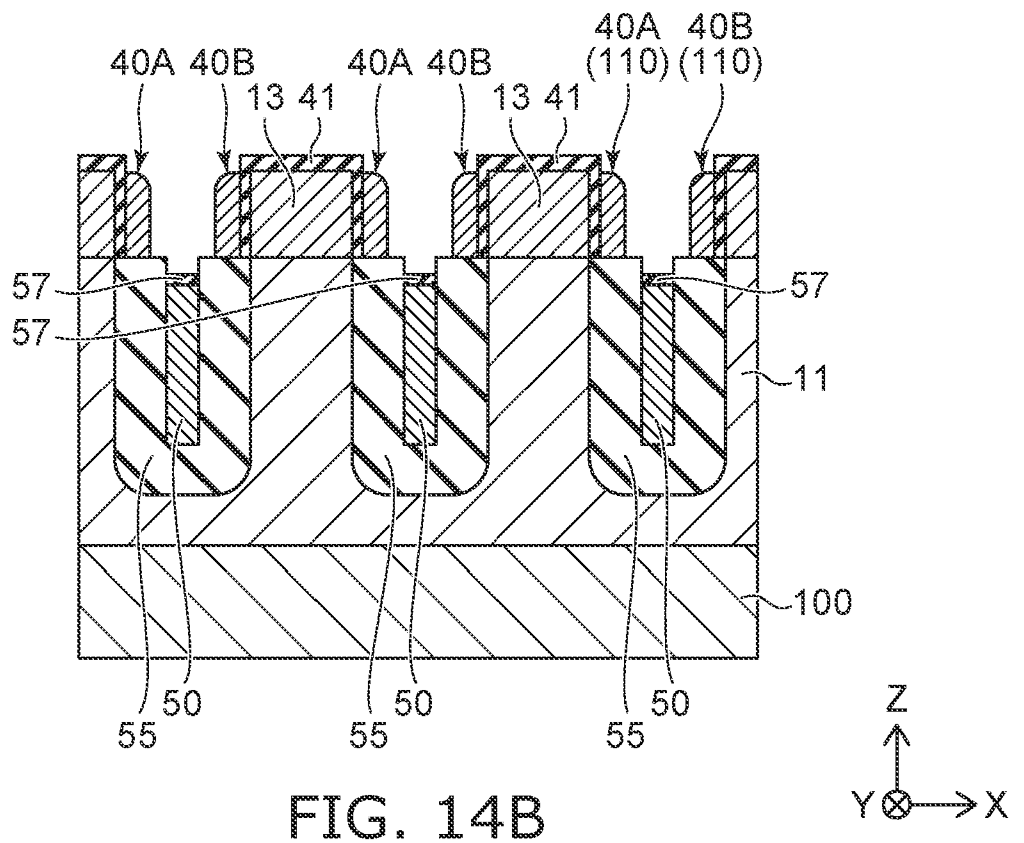

FIGS. 14A and 14B are schematic cross-sectional views showing a manufacturing method according to a modification of the embodiment. The manufacturing processes shown in FIGS. 14A and 14B are performed instead of the manufacturing processes shown in FIGS. 9A to 11A.

The conductive film 110 is formed as shown in FIG. 14A. The conductive film 110 covers the first insulating film 41, and covers the fourth insulating film 55 and the fifth insulating film 57 that are exposed in the third space SP3 (referring to FIG. 9A). The conductive film 110 is, for example, a conductive polysilicon film. The conductive film 110 is formed so that a fourth space SP4 remains in the upper portion of the trench TR.

As shown in FIG. 14B, the conductive film 110 is selectively removed so that a portion thereof remains on the wall surface of the trench TR. For example, the conductive film 110 is removed using anisotropic RIE, for example. The portion of the conductive film 110 that remains on the wall surface of the trench TR is the first and second control portions 40A and 40B of the control electrode 40. The first control portion 40A and the second control portion 40B each face the first semiconductor layer 11 via the first insulating film 41. The first control portion 40A and the second control portion 40B are formed to include upper ends that are oblique to the wall surface of the trench TR.

The second semiconductor layer 13 is formed on the first semiconductor layer 11. The second semiconductor layer 13 is formed by the ion-implantation of the second-conductivity-type impurity through the first insulating film 41 that is on the first semiconductor layer 11. The ion-implanted impurity is activated and diffused by heat treatment. The boundary between the first semiconductor layer 11 and the second semiconductor layer 13 is positioned at a level higher than the level of the boundary between the fourth insulating film 55 and the first and second control portions 40A and 40B. The second semiconductor layer 13 faces the first control portion 40A and the second control portion 40B via the first insulating film 41.

Figure 15:
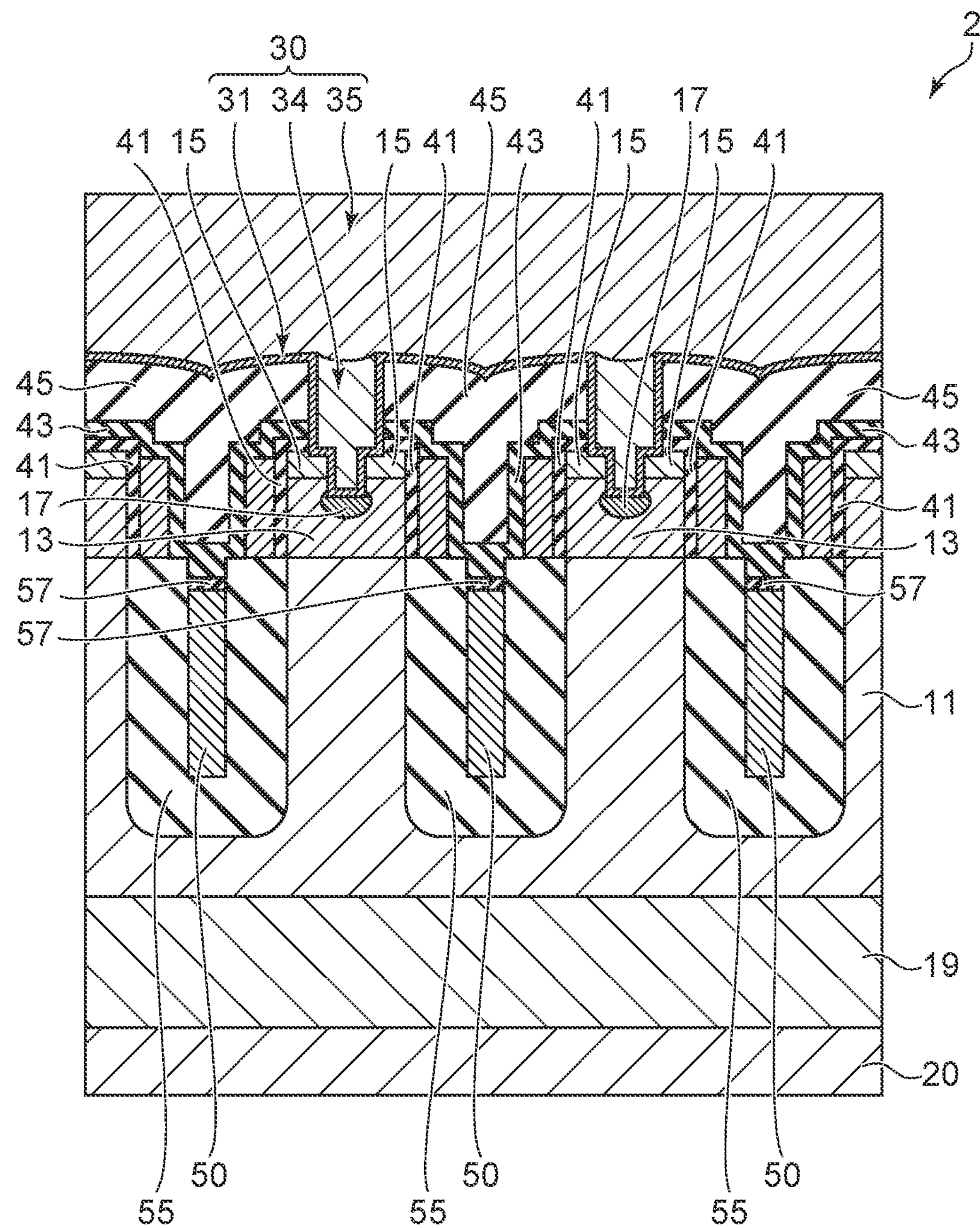
FIG. 15 is a schematic cross-sectional view showing a semiconductor device according to a modification of the embodiment.

FIG. 15 is a schematic cross-sectional view showing a semiconductor device 2 according to a modification of the embodiment. The semiconductor device 2 has the same trench gate structure as the semiconductor device 1.

As shown in FIG. 15, the second electrode 30 of the semiconductor device 2 includes the first metal layer 31, a second metal layer 34, and the third metal layer 35. The first metal layer 31 is provided on the third insulating film 45 and covers the inner surface of the contact trench CT (referring to FIG. 13A).

The contact trench CT is filled with the second metal layer 34. The second metal layer 34 is, for example, a tungsten layer that is formed using CVD. The second metal layer 34 is removed so that a portion thereof remains in the contact trench CT. The third metal layer 35 is provided on the first and second metal layers 31 and 34. In the example, the third metal layer 35 contacts the first metal layer 31 that is provided on the third insulating film 45.

In the semiconductor devices 1 and 2 according to the embodiment, the distance from the control electrode 40 to the third electrode 50 can be lengthened by providing the upper end of the third electrode 50 at a level lower than the level of the lower end of the control electrode 40. The gate-source parasitic capacitance can be reduced thereby, and the switching speed can be faster.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a semiconductor part including a first semiconductor layer of a first conductivity type, a second semiconductor layer of a second conductivity type, and a third semiconductor layer of the first conductivity type;

a first electrode provided on a back surface of the semiconductor part;

a second electrode provided at a front surface side of the semiconductor part, the first semiconductor layer extending between the first electrode and the second electrode, the second semiconductor layer being provided between the first semiconductor layer and the second electrode, the third semiconductor layer being provided between the second semiconductor layer and the second electrode;

a control electrode inside the semiconductor part, the control electrode including a first control portion and a second control portion arranged in a first direction, the first direction being directed along a boundary between the first electrode and the semiconductor part, the control electrode further including a connection portion, the first and second control portions being joined together at the connection portion;

a first insulating film provided between the second semiconductor layer of the semiconductor part and the first control portion or the second control portion of the control electrode;

a second insulating film provided between the first control portion and the second control portion of the control electrode, the second insulating film covering the first and second control portions;

a third insulating film including first to third portions, the first portion being provided between the first control portion and the second electrode, the second portion being provided between the second control portion and the second electrode, and the third portion being provided between the first portion and the second portion, the third portion extending between the first control portion and the second control portion, the second insulating film being provided between the control electrode and the third insulating film;

a third electrode extending in a second direction, the second direction being directed from the first electrode toward the second electrode, the third electrode being provided between the first electrode and the third portion of the third insulating film and between the first electrode and the connection portion of the control electrode;

a fourth insulating film provided between the first semiconductor layer and the third electrode, the first and second control portions of the control electrode being provided between the second electrode and the fourth insulating film;

a fifth insulating film provided between the third electrode and the third portion of the third insulating film and between the third electrode and the connection portion of the control electrode; and a sixth insulating film provided between the fifth insulating film and the connection portion of the control electrode, the sixth insulating film including a different material from a material of the fifth insulating film.

2. The device according to claim 1, wherein a distance from the third electrode to the first electrode is less than a distance from the control electrode to the first electrode.

3. The device according to claim 1, wherein the sixth insulating film is silicate glass including boron and phosphorus.

4. The device according to claim 1, wherein the third electrode includes an extension portion extending in the second direction, the third electrode is electrically connected to the second electrode at the extension portion, the extension portion is positioned at a level same as the control electrode in the second direction, and the fifth insulating film and the sixth insulating film extend between the extension portion and the control electrode.

5. The device according to claim 1, wherein the second insulating film includes a portion positioned between the third electrode and the third insulating film, and the portion of the second insulating film extends in the fourth insulating film.

6. The device according to claim 5, wherein the fifth insulating film is provided between the third electrode and the second insulating film.

7. The device according to claim 1, wherein the third insulating film is silicate glass including boron and phosphorus.

8. The device according to claim 1, wherein the first and second control portions of the control electrode contact the fourth insulating film, the first and second control portions each have a first width in the first direction, the fourth insulating film has a second width in the first direction at a portion contacting the control electrode, and the second width is greater than the first width.

9. The device according to claim 1, wherein the first and second control portions of the control electrode include end portions at the second electrode side, and the end portions are oblique to a wall surface of the forth insulating film.

* * * * *

UNITED STATES PATENT AND TRADEMARK OFFICE

CERTIFICATE OF CORRECTION

PATENT NO. : 12,094,968 B2
APPLICATION NO. : 17/461825
DATED : September 17, 2024
INVENTOR(S) : Hiroaki Katou et al.

It is certified that error appears in the above-identified patent and that said Letters Patent is hereby corrected as shown below:

In the Claims

Column 12, Line 6, Claim 1, insert --provided-- between the words “electrode” and “inside”.

Signed and Sealed this
Thirteenth Day of January, 2026

John A. Squires
*Director of the United States Patent and Trademark Office*